United States Patent
Park et al.

(10) Patent No.: US 12,349,560 B2
(45) Date of Patent: Jul. 1, 2025

(54) DISPLAY APPARATUS

(71) Applicant: SAMSUNG DISPLAY CO., LTD., Yongin-si (KR)

(72) Inventors: Junhyeong Park, Yongin-si (KR); Jaemin Shin, Yongin-si (KR); Sangwoo Kim, Yongin-si (KR); Hyejin Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 69 days.

(21) Appl. No.: 16/914,575

(22) Filed: Jun. 29, 2020

(65) Prior Publication Data
US 2021/0005700 A1    Jan. 7, 2021

(30) Foreign Application Priority Data

Jul. 5, 2019 (KR) .................. 10-2019-0081523

(51) Int. Cl.
| H10K 59/131 | (2023.01) |
| H10K 50/844 | (2023.01) |
| H10K 59/124 | (2023.01) |
| H10K 102/00 | (2023.01) |

(52) U.S. Cl.
CPC ......... *H10K 59/131* (2023.02); *H10K 50/844* (2023.02); *H10K 59/124* (2023.02); *H10K 2102/00* (2023.02)

(58) Field of Classification Search
CPC ............. H01L 27/3258; H01L 27/3276; H01L 51/5253; H01L 2251/301; H10K 59/124; H10K 59/131; H10K 50/844; H10K 2102/00
See application file for complete search history.

(56) References Cited

U.S. PATENT DOCUMENTS

| 8,432,334 B2 | 4/2013 | Bang et al. |
| 8,883,287 B2 | 11/2014 | Boyce et al. |
| 9,799,708 B2 | 10/2017 | Hong et al. |
| 10,056,435 B2 | 8/2018 | Hong et al. |

(Continued)

FOREIGN PATENT DOCUMENTS

| CN | 107994052 A | 5/2018 |
| CN | 109962175 A | 7/2019 |

(Continued)

OTHER PUBLICATIONS

Chinese Office Action Cited in Corresponding Chinese Application No. 202010596362.7, Dated Dec. 20, 2024.

*Primary Examiner* — Vongsavanh Sengdara
(74) *Attorney, Agent, or Firm* — F. CHAU & ASSOCIATES, LLC

(57) ABSTRACT

Provided is a display apparatus including a substrate having an island and a plurality of connection parts extending in different directions from an end of the island and connected to different islands; a display region disposed on the island and including a display element connected to a common electrode; a common voltage power line disposed on the island and on at least one first connection part of the plurality of connection parts extending from the island; and at least one contact portion disposed on the at least one first connection part, wherein the at least contact portion is connected to the common electrode and the common voltage line.

25 Claims, 11 Drawing Sheets

(56) References Cited

U.S. PATENT DOCUMENTS

| | | | |
|---|---|---|---|
| 10,224,506 B2 | 3/2019 | Shin | |
| 2006/0157711 A1 | 7/2006 | Kang | |
| 2015/0263308 A1 | 9/2015 | Park et al. | |
| 2017/0278920 A1* | 9/2017 | Park | H10K 50/844 |
| 2018/0114825 A1* | 4/2018 | Hong | H10K 59/121 |
| 2018/0374914 A1 | 12/2018 | Maeda | |
| 2019/0198782 A1 | 6/2019 | Kim et al. | |
| 2019/0207155 A1* | 7/2019 | Lee | H10K 59/8731 |
| 2019/0288014 A1* | 9/2019 | Wang | G02F 1/13454 |
| 2020/0119131 A1 | 4/2020 | Ohara | |
| 2021/0384286 A1 | 12/2021 | Ohara | |

FOREIGN PATENT DOCUMENTS

| | | | |
|---|---|---|---|
| CN | 109994520 A | 7/2019 | |
| JP | 2008-276253 A1 | 11/2008 | |
| JP | 2019-020462 A | 2/2019 | |
| KR | 10-2011-019498 | 2/2011 | |
| KR | 10-2016-0110689 | 9/2016 | |
| KR | 10-2017-0057911 | 5/2017 | |
| KR | 10-2017-0088013 A | 8/2017 | |
| WO | 2019012768 | 1/2019 | |

* cited by examiner

DISPLAY APPARATUS

CROSS-REFERENCE TO RELATED APPLICATION

This U.S. application claims the benefit of priority under 35 U.S.C. § 119 to Korean Patent Application No. 10-2019-0081523, filed on Jul. 5, 2019, in the Korean Intellectual Property Office, the disclosure of which is incorporated by reference in its entirety herein.

BACKGROUND

1. Technical Field

One or more embodiments relate to display apparatuses, and more particularly, to stretchable display apparatuses.

2. Discussion of Related Art

A flat panel display apparatus is an electronic viewing technology used to enable people to view content (e.g., still and moving images, text, etc.). Flat panel display apparatuses are far lighter, thinner, and use less power than traditional cathode ray tube television sets and video displays. Flat panel display apparatuses may include liquid-crystal displays, light-emitting diode displays, organic light-emitting diode displays, plasma displays, electroluminescent panels, and quantum dot light emitting diode displays.

However flat panel display apparatuses are typically rigid and may become damaged if bent. Flexible display apparatuses can be folded or rolled without being damaged. Stretchable display apparatuses also can be transformed into various shapes without being damaged.

SUMMARY

At least one exemplary embodiment of the disclosure provides a display apparatus having a stretchable or transformable shape.

According to an exemplary embodiment of the inventive concept, a display apparatus is provided that includes a substrate having an island and a plurality of connection parts extending in different directions from an end of the island and connected to different islands; a display region disposed on the island and including a display element connected to a common electrode; a common voltage power line disposed on the island and on at least one first connection part of the plurality of connection parts extending from the island; and at least one contact portion disposed on the at least one first connection part, where the at least one contact portion is connected to the common electrode and the common voltage line.

In an embodiment, the display apparatus further includes a driving voltage power line disposed on at least one of the islands, wherein the driving voltage power line is disposed on a layer different from a layer where the common voltage power line is disposed.

In an embodiment, the driving voltage power line is disposed on the at least one first connection part and arranged to overlap the common voltage power line.

In an embodiment, a width of the common voltage power line is greater than a width of the driving voltage power line.

In an embodiment, the display apparatus further includes a thin film transistor disposed on the island and connected to the display element; and an inorganic protection layer disposed between the thin film transistor and the display element, wherein the inorganic protection layer directly contacts the common electrode in an inorganic contact area, and the inorganic contact area is disposed to surround the display region.

In an embodiment, the at least one contact portion is disposed outside the inorganic contact area.

In an embodiment, the display apparatus further includes an encapsulation layer having an organic encapsulation layer, a first inorganic encapsulation layer disposed under the organic encapsulation layer, and a second inorganic encapsulation layer disposed on the organic encapsulation layer, wherein the organic encapsulation layer overlaps the display region, and the first inorganic encapsulation layer and the second inorganic encapsulation layer contact each other in the inorganic contact area.

In an embodiment, the first inorganic encapsulation layer and the second inorganic encapsulation layer are formed on the substrate, and the first inorganic encapsulation layer and the second inorganic encapsulation layer contact each other on the plurality of connection parts.

In an embodiment, the substrate include a plurality of through holes penetrating the substrate around the island, and the first inorganic encapsulation layer and the second inorganic encapsulation layer are disposed at least partially on a side surface of the plurality of through holes.

In an embodiment, the display apparatus further includes at least one inorganic insulating layer disposed under the display element, wherein the at least one inorganic insulating layer includes an opening area corresponding to at least a part of each of the plurality of connection parts, and the opening area is filled by at least one organic material layer.

In an embodiment, the contact portion is disposed on the at least one inorganic insulating layer.

In an embodiment, the display apparatus further includes a driving voltage power line disposed on at least one of the island and the plurality of connection parts, wherein the driving voltage power line is disposed on a same layer as a layer where the common voltage power line is disposed.

In an embodiment, a width of the common voltage power line is greater than a width of the driving voltage power line.

In an embodiment, the display apparatus further includes a driving voltage power line disposed on the island and on at least one second connection part of the plurality of connection parts extending in a direction different from a direction in which the at least one first connection part extends, wherein the common voltage power line crosses the driving voltage power line in the display region.

In an embodiment, the display apparatus further includes an upper scan line disposed on at least one second connection part of the plurality of connection parts extending in a direction different from a direction in which the at least one first connection part extends; and a lower scan line disposed on the island, wherein the upper scan line and the lower scan line are disposed in layers different from each other and are connected to each other via a contact hole disposed in the at least one second connection part.

In an embodiment, the display apparatus further includes a plurality of data lines disposed on the at least one first connection part, wherein the plurality of data lines and the upper scan lines are disposed on a same layer.

According to an exemplary embodiment of the inventive concept, a display apparatus is provided that includes a substrate having a plurality of islands spaced apart from each other, a plurality of connection parts connecting the plurality of islands, and a plurality of through holes penetrating the substrate between the plurality of connection parts; a plurality of display regions respectively disposed on the plurality of islands, each display region comprising an organic light-emitting diode; and an encapsulation layer hermetically sealing each of the plurality of display regions, wherein one of the connection parts includes a common voltage power line and a contact portion connected to a common electrode of the one organic light-emitting diode of one of the display regions of one of the islands and the common voltage power line.

In an embodiment, the display apparatus further includes a contact electrode disposed in the contact portion between the common electrode and the common voltage power line, wherein the contact electrode includes a same material as a material of a pixel electrode of the organic light-emitting diode.

In an embodiment, the display apparatus further includes a driving voltage power line disposed on the one island and on part of the plurality of connection parts, wherein the driving voltage power line is disposed on a layer different from a layer where the common voltage power line is disposed.

In an embodiment, the driving voltage power line is disposed to overlap at least part of the common voltage power line.

In an embodiment, the one display region furthers include a thin film transistor connected to the organic light-emitting diode; and an inorganic protection layer disposed between the thin film transistor and the organic light-emitting diode, wherein the inorganic protection layer directly contacts the common electrode in an inorganic contact area, and the inorganic contact area surrounds the one display region.

In an embodiment, the encapsulation layer includes a first inorganic encapsulation layer, an organic encapsulation layer, and a second inorganic encapsulation layer and the first inorganic encapsulation layer and the second inorganic encapsulation layer directly contact each other in the inorganic contact area.

According to an exemplary embodiment of the inventive concept, a display apparatus is provided that includes: a substrate including a first pair of islands spaced apart from each other in a first direction and a second pair of islands spaced apart from each other in the first direction, the first pair spaced apart from the second pair in a second direction different from the first direction, where each island includes a display region including at least one display element; a plurality of connection parts including a first connection part connecting the islands of the first pair, a second connection part connecting the islands of the second pair, a third connection part connecting a first island of each of the pairs, and fourth connection part connecting a second island of each of the pairs; and an inorganic layer entirely surrounding each of the display regions.

In an exemplary embodiment, the display apparatus includes a first power line for transmitting a first power voltage to one of the display regions of one of the islands, the first power line disposed on one of the connection parts connected to one end of the one island and on an additional connection part connected to another end of the one island; and a second power line for transmitting a second power voltage different from the first power voltage to the one display region, the second power line disposed on the one connection part and the additional connection part.

In an exemplary embodiment, the display apparatus includes a first power line for transmitting a first power voltage to one of the display regions of one of the islands, the first power line disposed on one of the connection parts connected to a first end of the one island and on a first additional connection part connected to a second end of the one island opposing the first end; and a second power line for transmitting a second power voltage different from the first power voltage to the one display region, the second power line disposed on a second additional connection part connected to a third end of the one island and on a third additional connection part connected to a fourth end of the one island opposing the third end.

BRIEF DESCRIPTION OF THE DRAWINGS

The above disclosure will be more apparent from the following description taken in conjunction with the accompanying drawings, in which.

DETAILED DESCRIPTION OF THE EXEMPLARY EMBODIMENTS

Figure 1:
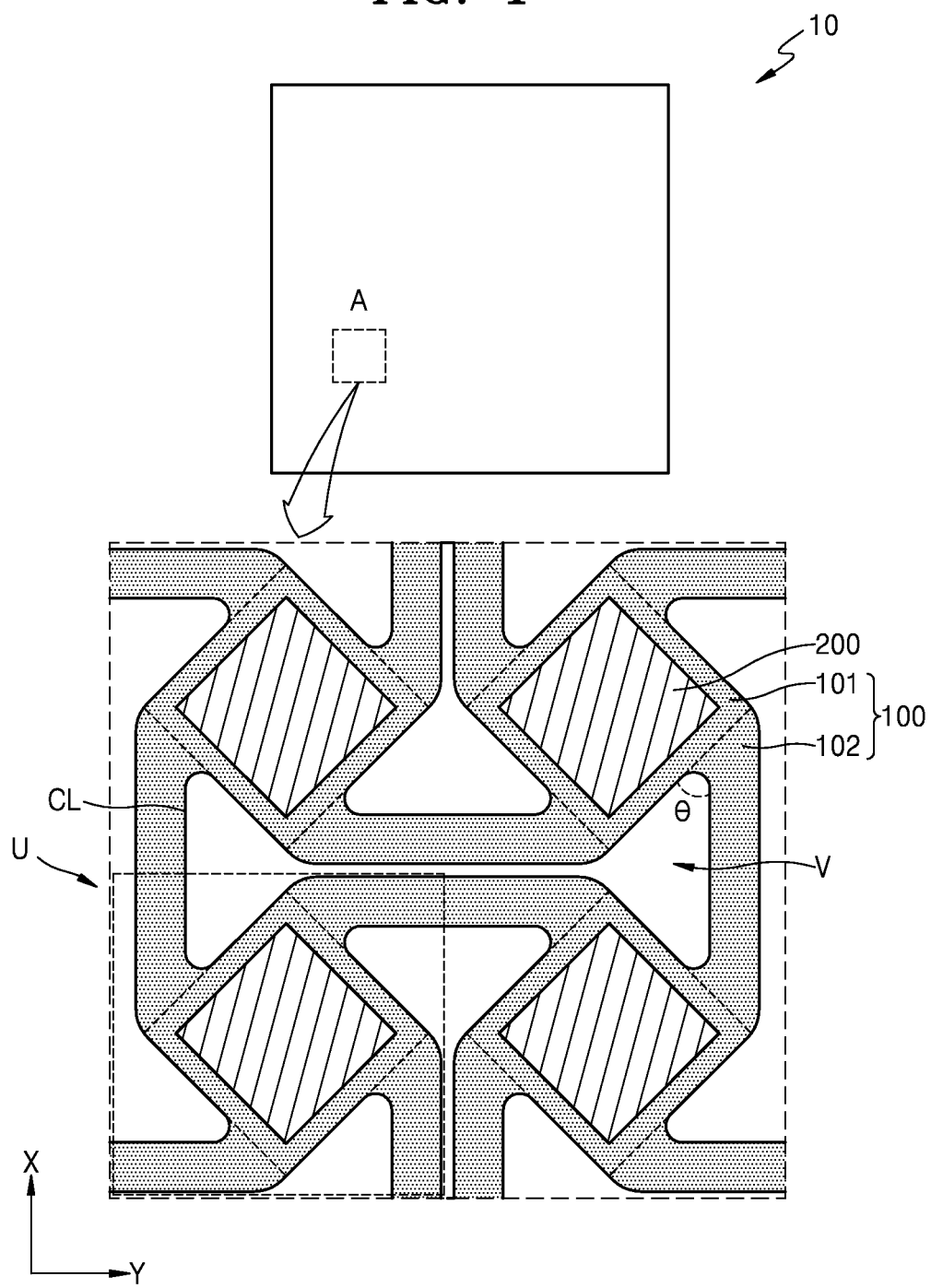
FIG. 1 is a schematic plan view of a display apparatus according to an exemplary embodiment of the disclosure.

Reference will now be made in detail to exemplary embodiments of the disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

In the following description, an expression used in the singular encompasses the expression of the plural, unless it has a clearly different meaning in the context.

In the following description, it will be understood that when a component, such as a layer, a film, a region, or a plate, is referred to as being "on" another component, the component can be directly on the other component or intervening components may be present thereon.

When a certain embodiment may be implemented differently, a specific process order may be performed differently from the described order. For example, two consecutively described processes may be performed substantially at the same time or performed in an order opposite to the described order.

In the following description, it will be understood that when a layer, region, or component is referred to as being "connected to" another layer, region, or component, it can be directly connected to the other layer, region, or component or indirectly connected to the other layer, region, or component via intervening layers, regions, or components. For example, in the present specification, when a layer, region, or component is referred to as being electrically connected to another layer, region, or component, it can be directly electrically connected to the other layer, region, or component or indirectly electrically connected to the other layer, region, or component via intervening layers, regions, or components.

Figure 2:
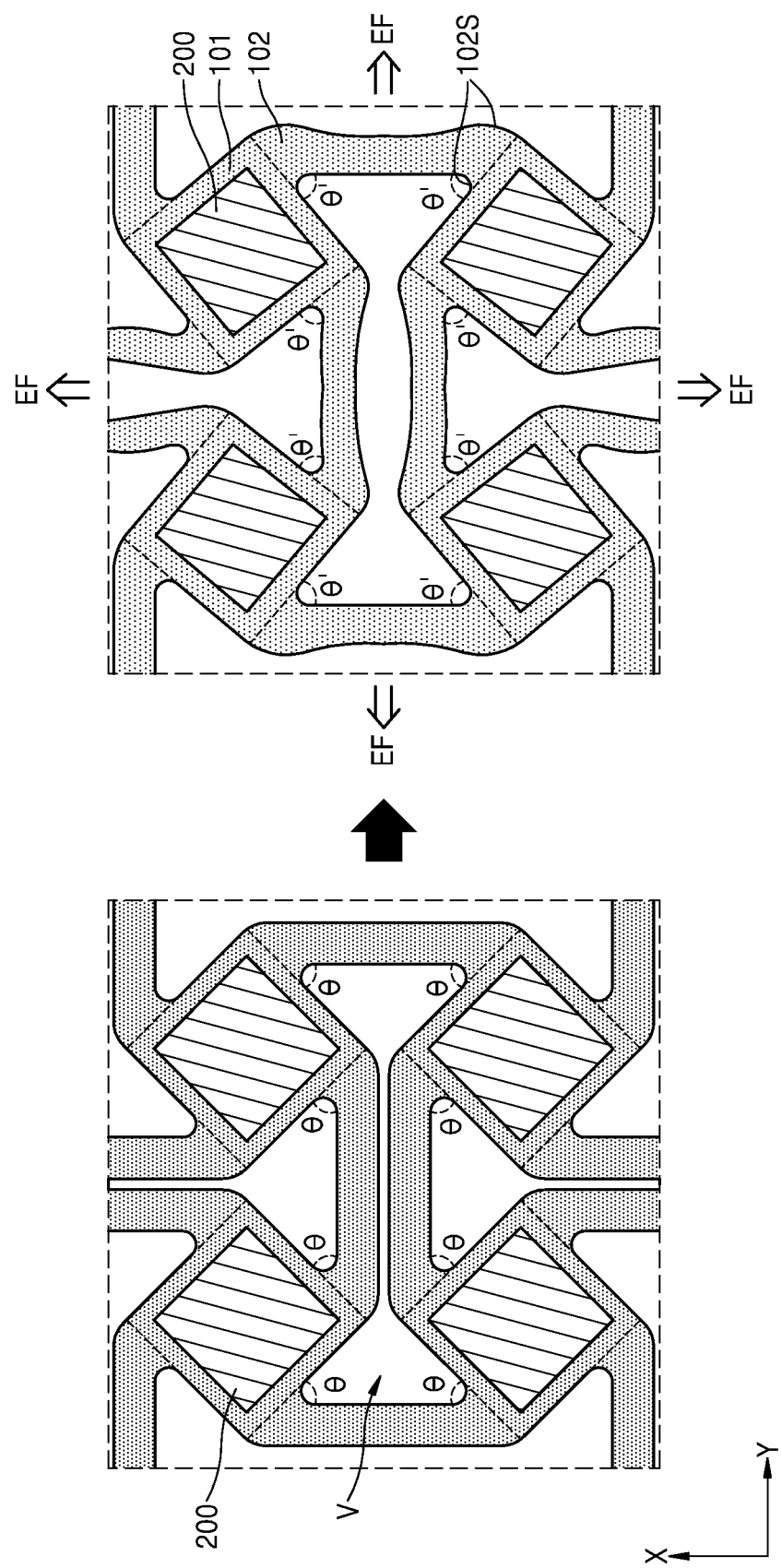
FIG. 2 is a schematic plan view of an example the region A of FIG. 1.

FIG. 1 is a schematic plan view of a display apparatus 10 according to an exemplary embodiment of the disclosure. FIG. 2 is a schematic plan view of an example of region A of FIG. 1.

Referring to FIG. 1, the display apparatus 10 according to an exemplary embodiment of the disclosure includes a substrate 100 and a plurality of display units 200 (e.g., display regions) disposed on the substrate 100.

The substrate 100 may include various materials. For example, the substrate 100 may include glass, metal, or other organic materials.

In an optional embodiment, the substrate 100 may include a flexible material. For example, the substrate 100 may include a bendable, foldable, or rollable material. A flexible material for forming the substrate 100 may be ultra thin glass, metal, or plastic. When the substrate 100 includes plastic, the substrate 100 may include polyimide PI. In another example, the substrate 100 may include another type of plastic material.

The substrate 100 includes a plurality of islands 101 separated from each other, a plurality of connection parts 102 connecting the islands 101 with each other, and a plurality of through holes V (bubbles, voids, spaces, etc.) that penetrate through the substrate 100 between the connection parts 102.

The islands 101 are arranged to be separated or spaced apart from each other. For example, the islands 101 are repeatedly arranged in a first direction X and a second direction Y that is different from the first direction X, forming a flat grid pattern. In an example, the first direction X and the second direction Y are directions perpendicular to each other. In another example, the first direction X and the second direction Y form an obtuse angle or an acute angle.

The display units 200 are arranged on the islands 101. A display unit 200 may include at least one display element to provide a visible ray or image.

The connection parts 102 connect the islands 101 with each other. In an exemplary embodiment, each of the islands 101 is connected to four connection parts 102. In an exemplary embodiment, the four connection parts 102 of an island 101 extend in directions different from each other, thereby surrounding the one island 101. For example, a first one of the four connection parts 102 may be connected to a first end of the one island 100, a second one of the four connection parts 102 may be connected to a second end of the one island 100 opposing the first end, a third one of the four connection parts 102 may be connected to a third end of the one island 100, and fourth one of the four connection parts 102 may be connected to a fourth end of the one island opposing the third end. For example, the four connection parts 102 can form a spoke. At least parts of the islands 101 and the connection parts 102 may be continuously formed of the same material. The islands 101 may be integrally formed with the connection parts 102.

The through holes V are formed by penetrating through the substrate 100. The through holes V may provide a separation area between the islands 101, thereby reducing the weight of the substrate 100 and enhancing flexibility of the substrate 100. Furthermore, when the substrate 100 is bent, folded, or rolled, as the shapes of the through holes V are changed, generation of stress during deformation of the substrate 100 is easily reduced, and thus, abnormal deformation of the substrate 100 may be prevented and durability thereof may be improved. As a result, user convenience may be improved during use of the display apparatus 10, and in particular, the display apparatus 10 may be easily applied to a wearable device such as a smartwatch.

The through holes V may be formed by removing an area of the substrate 100 by a method such as etching, and in another example, the through holes V may be formed during manufacture of the substrate 100. The through holes V may be formed in the substrate 100 using various methods.

In the following description, a basic unit U that is a basic unit for forming the substrate 100 is defined, and the structure of the substrate 100 is described in detail by using the same.

The basic unit U may be repeatedly arranged in the first direction X and the second direction Y. In other words, the substrate 100 may be interpreted to be formed by combining the basic units U repeatedly arranged in the first direction X and the second direction Y. The basic unit U may include one island 101 and at least one connection part 102 connected to the island 101. For example, the four connection parts 102 may be connected to the one island 101.

In an exemplary embodiment, the islands 101 of two neighboring basic units U are separated or spaced apart from each other, and the connection parts 102 of two neighboring basic units U may be connected to each other. The connection part 102 included in the basic unit U may refer to a partial area of the connection part 102 located in an area of the basic unit U, or the entirety of the connection part 102 that connects the two islands 101 between the two neighboring islands 101. In an exemplary embodiment, two neighboring islands 101 are spaced apart from one another but connected to one another via a connection part 102.

Four neighboring basic units U among the basic units U form a closed loop CL therebetween, and the closed loop CL may define the through holes V that are empty spaces. The through holes V, which are areas formed by removing a partial area of the substrate 100, may improve the flexibility of the substrate 100 and reduce stress generated when the substrate 100 is deformed. In an exemplary embodiment, the connection part 102 has a width that is less than a width of the island 101, and thus, the through holes V may be in contact with the islands 101 of the four basic units U. For example, a width of a connection part 102 in the second direction Y may be less than a width of an island 101.

The two neighboring basic units U of the basic units U may be symmetrical to each other. In an exemplary embodiment, as illustrated in FIG. 1, one basic unit U is symmetrical to another basic unit U disposed adjacent thereto in the second direction Y with respect to an axis of symmetry that is parallel to the first direction X, and simultaneously symmetrical to another basic unit U disposed adjacent thereto in the first direction X with respect to an axis of symmetry that is parallel to the second direction Y.

Furthermore, an angle θ formed by a direction in which the connection part 102 extends and a side surface of the island 101 to which the connection part 102 is connected may be acute. For example, when the island 101 has a rectangular shape, and corner portions of a rectangle of the shape are arranged to face the first direction X and the second direction Y, the connection parts 102 may be connected to the island 101 in areas adjacent to the corner portions and may extend in a direction parallel to the second direction Y or the first direction X. In other words, the connection part 102 connected to a corner portion located in the first direction X may extend in the second direction Y or a −second direction −Y, and the connection part 102 connected to a corner portion located in the second direction Y may extend in the first direction X or a −first direction −X. For example, the −first direction −X may be in a direction that is opposite to the first direction X and the −second direction −Y may be in a direction that is opposite to the second direction Y. Accordingly, side surfaces of the two neighboring islands 101 connected to one connection part 102 and the direction in which the connection part 102 extends may form an acute angle. Accordingly, the islands 101 may be densely arranged, the lengths of the connection parts 102 may be reduced, and the size of the through holes V may be increased. Furthermore, as illustrated in FIG. 2, the substrate 100 may be provided with stretching properties.

FIG. 2 illustrates a shape when the substrate 100 is stretched in the first direction X and the second direction Y. Referring to FIG. 2, when an external force EF is applied to the substrate 100, angles between the side surfaces of the island 101 to which the connection part 102 is connected and the connection part 102 are all increased ($\theta < \theta'$), and thus, the size of the through holes V may be increased. Accordingly, as the interval between the islands 101 increases, the substrate 100 may be stretched in the first direction X and the second direction Y, and thus, the shape of the substrate 100 may be changed in two dimensions or three dimensions.

Since the connection part 102 has a width that is less than the width of the island 101, when an external force is applied to the substrate 100, the shape change for increasing the angle $\theta$ mainly occurs in the connection part 102 and the shape of the island 101 may not be changed even in the stretching of the substrate 100. Accordingly, the display unit 200 disposed on the island 101 may be stably maintained even when the substrate 100 is stretched. Thus, the display apparatus 10 may be easily applied to display apparatuses needing flexibility, for example, bending (e.g., bendable) display apparatuses, flexible display apparatuses, or stretchable display apparatuses.

When the substrate 100 is stretched, stress concentrates on a contact portion of the connection part 102 connected to the side surface of a corresponding island 101. Thus, to prevent tearing of the connection part 102 due to the concentration of stress, the contact portion of the connection part 102 may include a curved surface 102C.

The display unit 200 is provided with pixels PX having display elements to provide a certain image. Each pixel PX may emit, for example, red, green, blue, or white light. For example, each pixel PX may include an organic light-emitting diode. Furthermore, each pixel PX may further include a device such as a thin film transistor TFT or a capacitor.

In an exemplary embodiment, the pixel PX denotes a sub-pixel that emits, as described above, any of red, green, blue, and white light.

Although an organic light-emitting display apparatus is described above as an example of the display apparatus 10, the display apparatus 10 of the disclosure is not limited thereto. For example, the display apparatus may be a liquid crystal display, an electrophoretic display, an organic light-emitting display, an inorganic electroluminescent (EL) display, a field emission display, a surface-conduction electron-emitter display, a plasma display, or a cathode ray display FIGS. 3A and 3B are equivalent circuit diagrams of any one pixel of a display apparatus according to an exemplary embodiment of the disclosure.

Figure 3A:
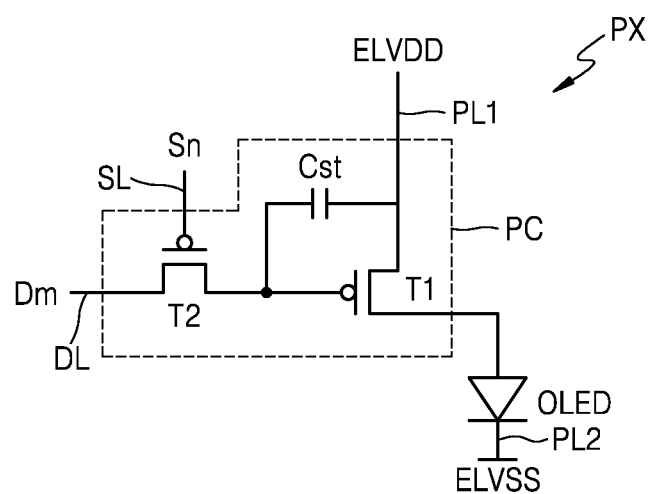
FIGS. 3A and 3B are equivalent circuit diagrams of any one pixel of a display apparatus according to an exemplary embodiment of the disclosure.
Figure 3B:
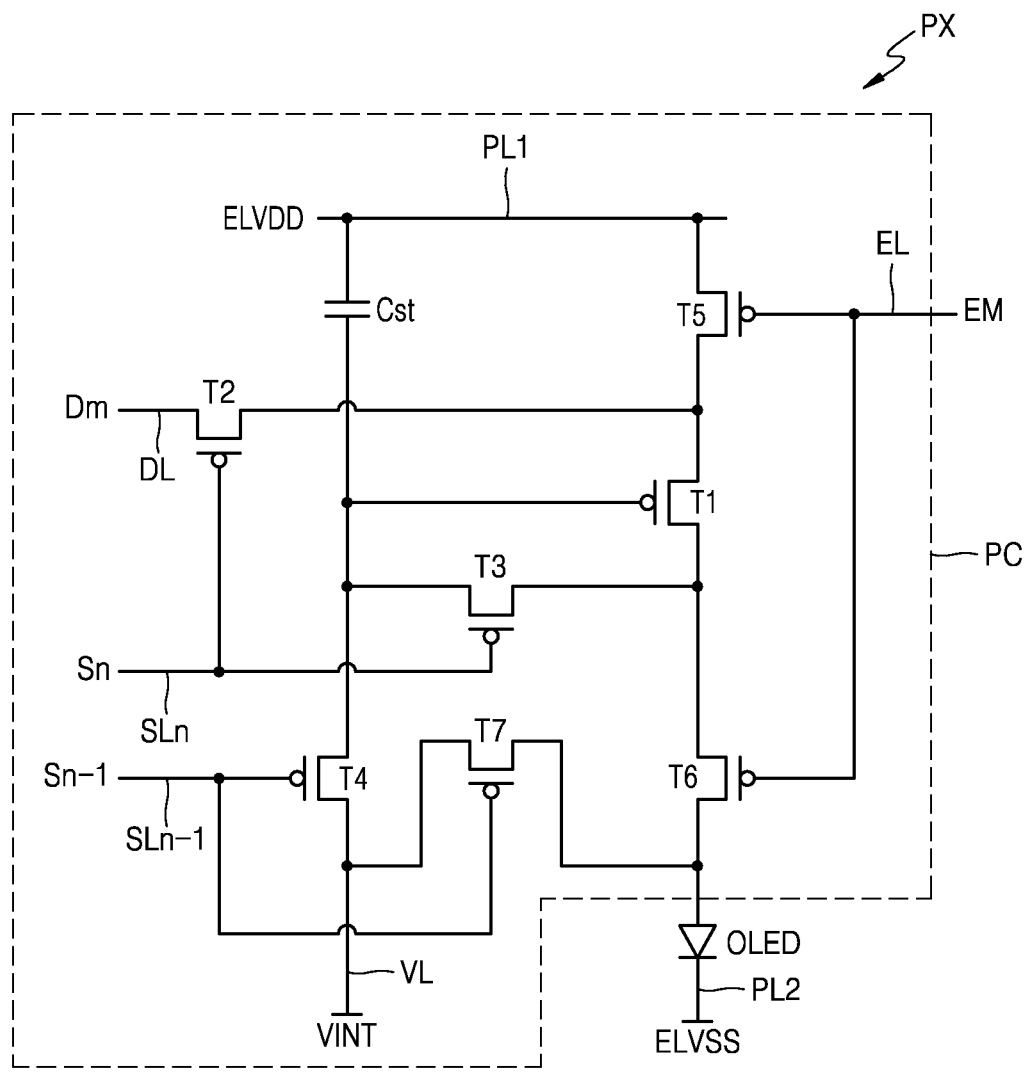

Referring to FIG. 3A, each pixel PX includes a pixel circuit PC connected to a scan line SL (e.g., gate line) and a data line DL and an organic light-emitting diode OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL and transmit, in response to a scan signal Sn input through the scan line SL, a data signal Dm input through the data line DL to the driving thin film transistor T1.

The storage capacitor Cst may be connected to the switching thin film transistor T2 and a first power line PL1 and may store a voltage corresponding to a difference between a voltage received from the switching thin film transistor T2 and a first power voltage (ELVDD or a driving voltage) supplied to the first power line PL1.

The driving thin film transistor T1 may be connected to the first power line PL1 and the storage capacitor Cst and, in response to a voltage value stored in the storage capacitor Cst, may control a driving current flowing through the organic light-emitting diode OLED from the first power line PL1. The organic light-emitting diode OLED may emit light having a certain luminance according to the driving current.

Although FIG. 3A illustrates a case in which the pixel circuit PC includes two thin film transistors and one storage thin film transistor, the disclosure is not limited thereto. For example, the pixel circuit PC may include additional thin film transistors.

Referring to FIG. 3B, the pixel circuit PC includes driving and switching thin film transistors T1 and T2, a compensation thin film transistor T3, a first initialization thin film transistor T4, an operation control thin film transistor T5, an emission control thin film transistor T6, and a second initialization thin film transistor T7.

Although FIG. 3B illustrates a case in which signal lines SLn, SLn−1, EL, and DL, an initialization voltage line VL, and the first power line PL1 are provided for each pixel PX, the disclosure is not limited thereto. In another embodiment, at least one of the signal lines SLn, SLn−1, EL, and DL or/and the initialization voltage line VL may be shared by neighboring pixels.

A drain electrode of the driving thin film transistor T1 is electrically connected to the organic light-emitting diode OLED via the emission control thin film transistor T6. The driving thin film transistor T1 supplies the driving current to the organic light-emitting diode OLED by receiving the data signal Dm in response to a switching operation of the switching thin film transistor T2.

A gate electrode of the switching thin film transistor T2 is connected to a scan line (e.g., SLn), and a source electrode thereof is connected to the data line DL. A drain electrode of the switching thin film transistor T2 is connected to a source electrode of the driving thin film transistor T1 and is connected to the first power line PL1 via the operation control thin film transistor T5.

The switching thin film transistor T2 may be turned on in response to the scan signal Sn received through the scan line SL and may perform a switching operation to transmit the data signal Dm through the data line DL to the source electrode of the driving thin film transistor T1.

A gate electrode of the compensation thin film transistor T3 is connected to a scan line SLn. A source electrode of the compensation thin film transistor T3 is connected to the drain electrode of the driving thin film transistor T1 and to a pixel electrode of the organic light-emitting diode OLED via the emission control thin film transistor T6. A drain electrode of the compensation thin film transistor T3 is connected to a first electrode of the storage capacitor Cst, a source electrode of the first initialization thin film transistor T4, and a gate electrode of the driving thin film transistor T1. The compensation thin film transistor T3 may be turned on in response to a scan signal Sn received through the scan line SL and may diode-connect the driving thin film transistor T1 by connecting the gate electrode and the drain electrode of the driving thin film transistor T1 with each other.

A gate electrode of the first initialization thin film transistor T4 is connected to a previous scan line SLn−1. A drain electrode of the first initialization thin film transistor T4 is connected to the initialization voltage line VL. A source electrode of the first initialization thin film transistor T4 is connected to the first electrode of the storage capacitor Cst, the drain electrode of the compensation thin film transistor T3, and the gate electrode of the driving thin film transistor T1. The first initialization thin film transistor T4 may be turned on in response to a previous scan signal Sn−1 received through the previous scan line SLn−1 and transmits an initialization voltage VINT to the gate electrode of the driving thin film transistor T1, thereby performing an initialization operation of initializing a voltage of the gate electrode of the driving thin film transistor T1.

A gate electrode of the operation control thin film transistor T5 is connected to an emission control line EL. A source electrode of the operation control thin film transistor T5 is connected to the first power line PL1. A drain electrode of the operation control thin film transistor T5 is connected to the source electrode of the driving thin film transistor T1 and the drain electrode of the switching thin film transistor T2.

A gate electrode of the emission control thin film transistor T6 is connected to the emission control line EL. A source electrode of the emission control thin film transistor T6 is connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 may be simultaneously turned on in response to an emission control signal EM received through the emission control line EL and may transmit the first power voltage ELVDD to the organic light-emitting diode OLED, and thus the driving current flows in the organic light-emitting diode OLED.

A gate electrode of the second initialization thin film transistor T7 is connected to a previous scan line (e.g., SLn−1). A source electrode of the second initialization thin film transistor T7 is connected to the pixel electrode of the organic light-emitting diode OLED. A drain electrode of the second initialization thin film transistor T7 is connected to the initialization voltage line VL. The second initialization thin film transistor T7 may be turned on in response to the previous scan signal Sn−1 received through the previous scan line SLn−1 and may initialize the pixel electrode of the organic light-emitting diode OLED.

Although FIG. 3B illustrates a case in which the first initialization thin film transistor T4 and the second initialization thin film transistor T7 are connected to the previous scan line SLn−1, the disclosure is not limited thereto. In another embodiment, the first initialization thin film transistor T4 may be connected to the previous scan line SLn−1 and may be driven by the previous scan signal Sn−1, and the second initialization thin film transistor T7 may be connected to a separate signal line, for example, a next scan line, and may be driven by a signal transmitted to the corresponding scan line.

The second electrode of the storage capacitor Cst is connected to the first power line PL1. The first electrode of the storage capacitor Cst is connected to the gate electrode of the driving thin film transistor T1, the drain electrode of the compensation thin film transistor T3, and the source electrode of the first initialization thin film transistor T4.

A common electrode, for example, a cathode, of the organic light-emitting diode OLED is connected to a second power line PL2 and receives a second power voltage (ELVSS or a common power voltage). The organic light-emitting diode OLED may emit light by receiving the driving current from the driving thin film transistor T1. The second power voltage may be a ground voltage. The second power voltage may be lower than the first power voltage.

The pixel circuit PC is not limited to the numbers of thin film transistors and storage capacitors and the circuit design described with reference to FIGS. 3A and 3B, as the numbers and the circuit design may be variously changed.

Figure 4:
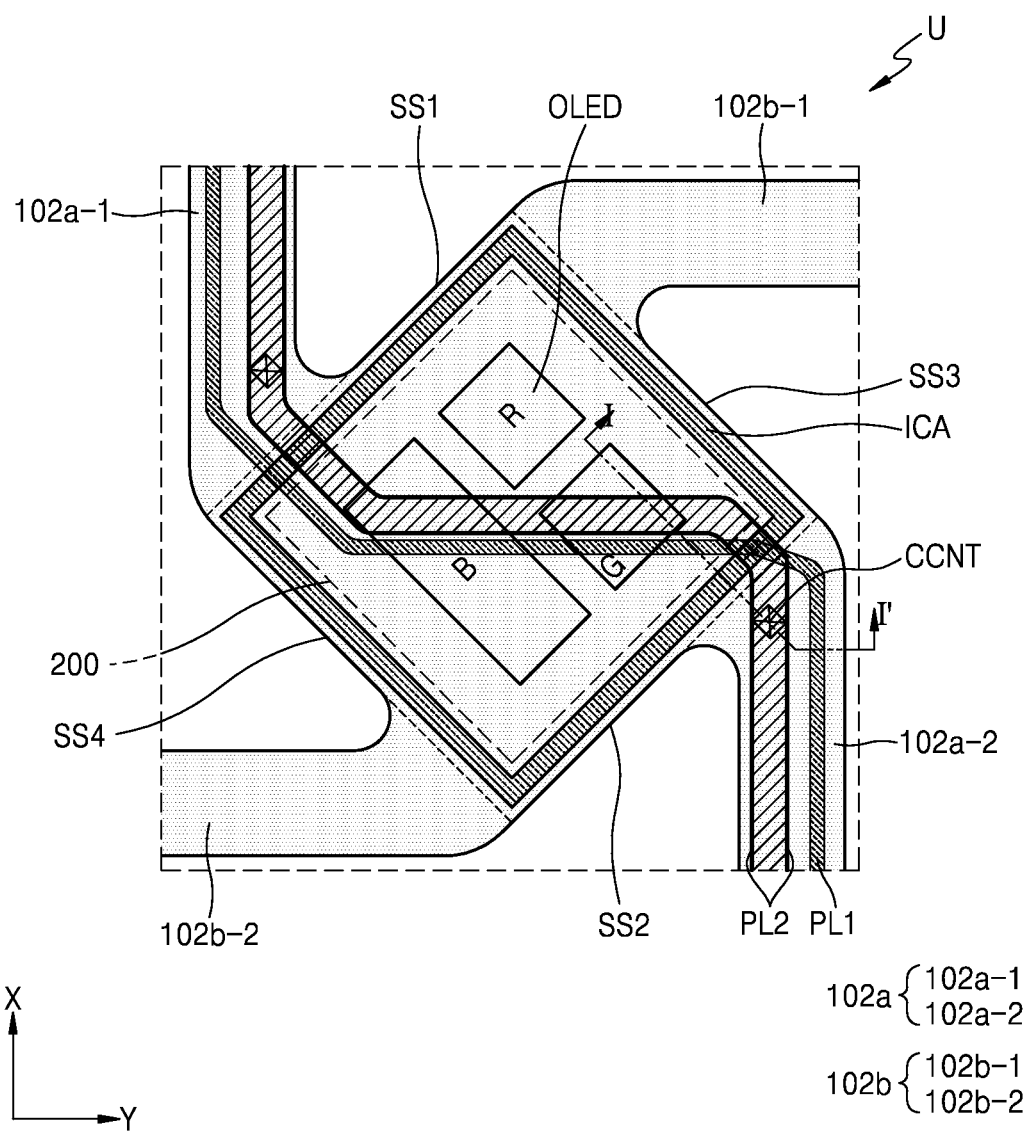
FIG. 4 is a schematic plan view of a basic unit of a substrate of the display apparatus according to an exemplary embodiment of the disclosure.
Figure 5:
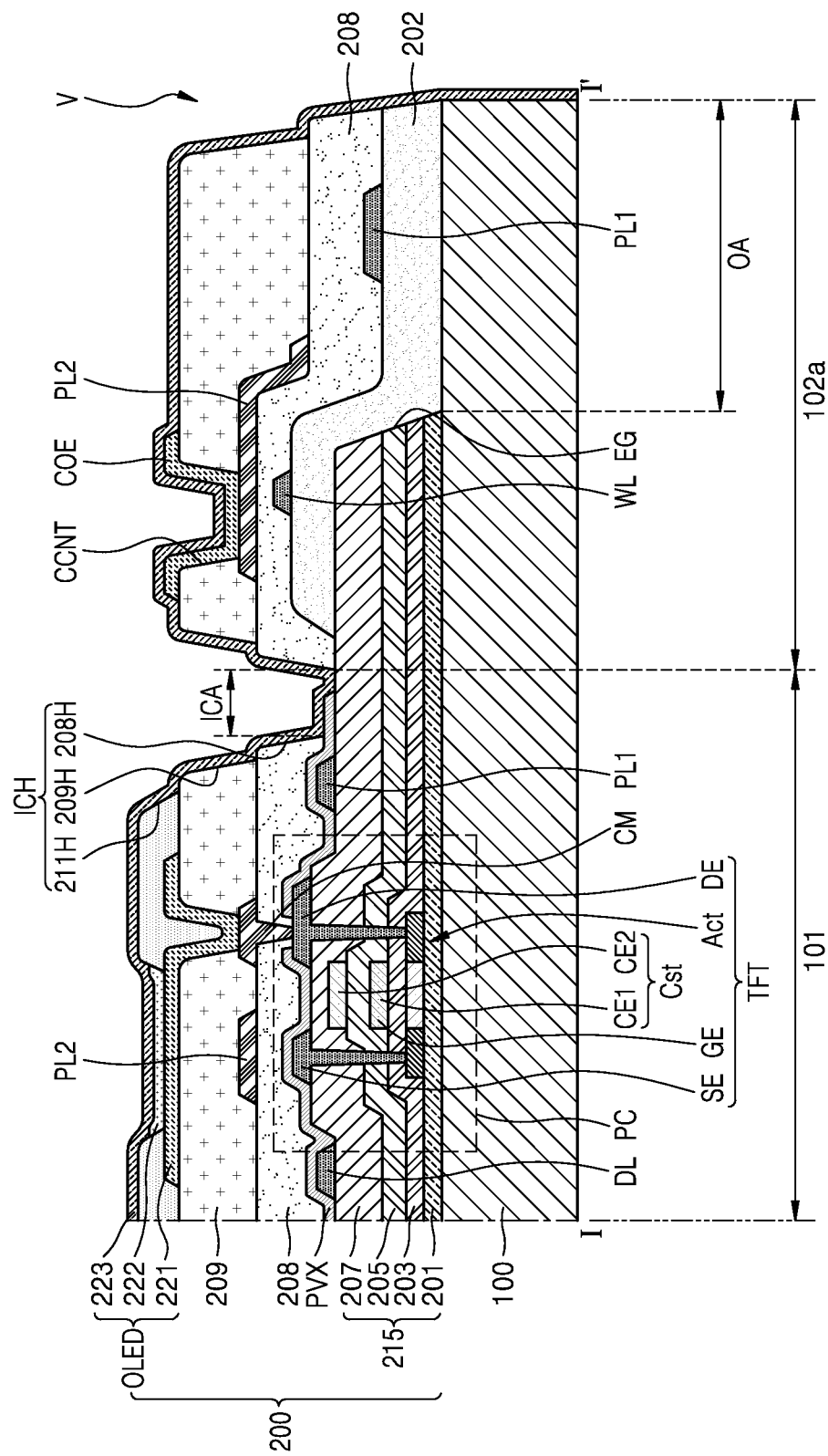
FIG. 5 is a schematic cross-sectional view taken along line I-I' of FIG. 4.

FIG. 4 is a schematic plan view of the basic unit U according to an exemplary embodiment of the disclosure. FIG. 5 is a schematic cross-sectional view taken along line I-I' of FIG. 4.

Referring to FIGS. 4 and 5, the display unit 200 (e.g., a display region) and an inorganic contact area ICA surrounding the display unit 200 may be located on the island 101 of the basic unit U, and the connection part 102 may include a pair of first connection parts 102a located at opposite sides with respect to the island 101 and extending in a direction parallel to the first direction X and a pair of second connection parts 102b located at opposite sides with respect to the island 101 and extending in a direction parallel to the second direction Y.

The first connection parts 102a may include a first sub connection part 102a-1 and a second sub connection part 102a-2. The second connection parts 102b may include a third sub connection part 102b-1 and a fourth sub connection part 102b-2. The first sub connection part 102a-1 may be connected to the first side SS1 of the island and extend in the +X direction. The second sub connection part 102a-2 may be connected to the second side SS2 opposite to the first surface SS1, and extend in the −X direction. The third sub connection part 102b-1 may be connected to the third side SS3 of the island and extend in the +Y direction. The fourth sub connection part 102b-2 may be connected to the second side SS4 opposite to the first surface SS3, and extend in the −Y direction.

The display unit 200 is located on the island 101. At least one organic light-emitting diode OLED that emits, for example, red, blue, green, or white light may be located within the display unit 200. In an embodiment, the organic light-emitting diode OLED is electrically connected to the thin film transistor TFT. In the present embodiment, the organic light-emitting diode OLED is described as the display element. However, embodiments of the disclosure are not limited thereto, as the display unit 200 may include various types of display elements such as an inorganic EL device, a quantum dot light-emitting device, or a liquid crystal device.

The display units 200 each may include a plurality of OLEDs for light of different colors. For example, as illustrated in FIG. 4, one display unit 200 may include an OLED for emitting red R light, an OLED for emitting green G light, and an OLED for emitting blue B light.

However, embodiments of the disclosure are not limited thereto. In another example, each of the display units 200 may include only one organic light-emitting diode OLED for emitting red, blue, green, or white light so that each of the display units 200 may form a sub-pixel.

Furthermore, the organic light-emitting diodes OLEDs in the display unit 200 may be arranged in various ways such as an RGB method, a pentile structure, or a honeycomb structure according to the efficiency of a material of an organic light-emitting layer.

In an exemplary embodiment, the display unit 200 on the island 101 is entirely surrounded by the inorganic contact area ICA. For example, one or more inorganic layers may surround each display unit 200. In this regard, FIG. 4 illustrates that a red R OLED, a green G OLED, and a blue B OLED are entirely surrounded, on a plane, by the inorganic contact area ICA.

In an exemplary embodiment, the inorganic contact area ICA is an area formed of at least two layers directly contacting each other including an inorganic material. The inorganic contact area ICA may prevent intrusion of external moisture into the display element provided in each pixel. The inorganic contact area ICA may extend along an edge of the island 101, and pixels may be disposed inside the inorganic contact area ICA.

In an exemplary embodiment, the connection part 102 is disposed outside the inorganic contact area ICA, and lines connected to the display unit 200 are disposed on the connection part 102. In an exemplary embodiment, all or a portion of the lines pass through a connection part 102. For example, a power line could pass through a connection part 102 such that the connection part entirely surrounds the power line.

For example, the first power line PL1 (or a driving voltage power line) for transmitting the first power voltage ELVDD (see FIGS. 3A and 3B) to the display unit 200 and the second power line PL2 (or a common voltage power line) for transmitting the second power voltage ELVSS (see FIGS. 3A and 3B) to the display unit 200 may be connected to the display units 200 through the connection part 102.

In an exemplary embodiment, as illustrated in FIG. 4, the first power line PL1 and the second power line PL2 are disposed in the first connection parts 102a extending in the first direction (X direction) and traverse the display unit 200. For example, a part of the power line PL1 and the second power line PL2 may overlap the display unit 200. In another embodiment, the first power line PL1 and the second power line PL2 are disposed in the second connection parts 102b extending in the second direction (Y direction) and traverse the display unit 200. In another embodiment, the first power line PL1 is disposed in the first connection parts 102a, and the second power line PL2 is disposed in the second connection parts 102b. For example, the first connection parts 102a could entirely surround the first power line PL1 and the second connection parts 102b could entirely surround the second power line PL2.

As illustrated in FIG. 5, the first power line PL1 and the second power line PL2 may be disposed in different layers so as to cross each other inside the island 101. However, embodiments of the disclosure are not limited thereto. In an exemplary embodiment, the first power line PL1 and the second power line PL2 do not cross each other on a plane, and the first power line PL1 and the second power line PL2 may be disposed on the same layer. While FIG. 4 illustrates a width of the second power line PL2 as being greater than a width of the first power line PL1, embodiments of the disclosure are not limited thereto. For example, the power lines PL1 and PL2 may have the same or substantially the same width or the first power line PL1 could be greater than the second power line PL2.

The connection part 102 may be provided with a common electrode contact portion (CCNT; hereinafter, referred to as the contact portion) for applying a certain voltage to a common electrode of each display element. Since the common electrode of the display element and the second power line PL2 are connected to each other through the contact portion CCNT, a second driving voltage (ELVSS) may be transmitted to the common electrode. The contact portion CCNT may be disposed outside the inorganic contact area ICA.

The contact portion CCNT may be disposed in the first connection parts 102a of the connection part 102. The contact portion CCNT may be disposed in both of the first connection parts 102a, or in any one of the first connection parts 102a. However, embodiments of the disclosure are not limited thereto. The contact portion CCNT may be variously deformed according to the arrangement position of the second power line PL2. For example, the contact portion CCNT may be disposed in a second connection part 102b.

In an embodiment, the contact portion CCNT may be provided for each basic unit U. In another embodiment, the contact portion CCNT may be periodically provided for each basic unit U, not for every basic unit U.

Although not illustrated in FIG. 4, various signal lines, for example, the data line DL and a scan line SL, may be disposed in the connection part 102 and the display unit 200.

A stack structure of a display apparatus according to an exemplary embodiment of the disclosure is described below with reference to FIG. 5. First, the display unit 200 disposed on the island 101 is described in a stacking order.

A buffer layer 201 is formed on the island 101. The buffer layer 201 may prevent intrusion of impurities into a semiconductor layer Act of the thin film transistor TFT. The buffer layer 201 may include an inorganic insulating material such as silicon oxide SiNx or silicon nitride SiOx and may include a single layer or a multilayer including the above-described inorganic insulating material.

The pixel circuit PC is disposed on the buffer layer 201. The pixel circuit PC includes the thin film transistor TFT and the storage capacitor Cst. The thin film transistor TFT includes the semiconductor layer Act, a gate electrode GE, a source electrode SE, and a drain electrode DE. Although, in the present embodiment, a top gate type is illustrated in which the gate electrode GE is disposed on the semiconductor layer Act with a gate insulating layer 203 therebetween, according to another embodiment, the thin film transistor TFT may be of a bottom gate type.

The semiconductor layer Act may include polysilicon. Alternatively, the semiconductor layer Act may include amorphous silicon, an oxide semiconductor, or an organic semiconductor. The gate electrode GE may include a low resistance metal material. The gate electrode GE may include a conductive material including aluminum (Al), copper (Cu), or titanium (Ti), and may include a multilayer or a single layer including the above material.

The gate insulating layer 203 between the semiconductor layer Act and the gate electrode GE may include an inorganic insulating material such as silver silicon oxide, silicon nitride, silicon oxynitride, aluminum oxide, titanium oxide, tantalum oxide, or hafnium oxide. The gate insulating layer 203 may include a single layer or a multiple layer including the above-described material.

The source electrode SE and the drain electrode DE may include a material exhibiting superior conductivity. The source electrode SE and the drain electrode DE may include a conductive material including molybdenum (Mo), aluminum (Al), copper (Cu), or titanium (Ti), and may include a multiple layer or a single layer including the above-described material. In an embodiment, the source electrode SE and the drain electrode DE may include a multiple layer of Ti/Al/Ti.

The storage capacitor Cst includes a lower electrode CE1 and an upper electrode CE2 that overlap each other with a first interlayer insulating layer 205 therebetween. The storage capacitor Cst may overlap the thin film transistor TFT. In this regard, FIG. 5 illustrates that the gate electrode GE of the thin film transistor TFT is the lower electrode CE1 of the storage capacitor Cst. In another embodiment, the storage capacitor Cst does not overlap the thin film transistor TFT. The storage capacitor Cst is covered by a second interlayer insulating layer 207.

The source electrode SE and the drain electrode DE, the data line DL, and the first power line PL1 are disposed on the second interlayer insulating layer 207. The source electrode SE and the drain electrode DE may be connected to the semiconductor layer Act via a through hole that penetrates the second interlayer insulating layer 207, the first interlayer insulating layer 205, and the gate insulating layer 203.

The first and second interlayer insulating layers 205 and 207 may include an inorganic insulating material such as a silver silicon oxide, a silicon nitride, a silicon oxynitride, an aluminum oxide, a titanium oxide, a tantalum oxide, or a hafnium oxide. The first and second interlayer insulating layers 205 and 207 each may include a single layer or a multiple layer including the above-described material.

An inorganic protection layer PVX is disposed on the thin film transistor TFT, the data line DL, and the first power line PL1. The inorganic protection layer PVX may cover and protect the source electrode SE and the drain electrode DE of the thin film transistor TFT, the data line DL, and the first power line PL1. Lines (not shown) formed together in the same process of forming the source electrode SE may be exposed in a partial area of the substrate 100. The exposed portion of the lines may be damaged by an etchant used for patterning of a pixel electrode 221. In the present embodiment illustrated in FIG. 5, since the inorganic protection layer PVX covers at least part of the lines, the lines may be prevented from being damaged in the patterning process of the pixel electrode 221.

The inorganic protection layer PVX may include a single layer or a multiple layer of a silver silicon nitride (SiNx) and a silicon oxide (SiOx).

A lower planarization layer 208 may be disposed on the inorganic protection layer PVX. The lower planarization layer 208 may include an organic insulating material such as general purpose polymers. The general purpose polymers may include polymethylmethacrylate (PMMA) or polystyrene (PS), polymer derivatives having phenolic groups, acrylic polymers, imide-based polymers, aryl ether-based polymers, amide-based polymers, fluorine-based polymers, p-xylene-based polymers, vinyl alcohol-based polymers, and blends thereof.

In an exemplary embodiment, a connection metal CM connecting the pixel electrode 221 to the thin film transistor TFT is disposed on the lower planarization layer 208. In an exemplary embodiment, the second power line PL2 is disposed on the same layer as the connection metal CM. The connection metal CM and the second power line PL2 may include a conductive material including molybdenum (Mo), aluminum (Al), copper (Cu), or titanium (Ti) and may include a multiple layer or a single layer including the above-described material. The second power line PL2 may be disposed to partially overlap the first power line PL1 or the data line DL. Since the lower planarization layer 208 is provided, lines may be disposed on an upper surface of the lower planarization layer 208, and thus, the density of the display unit 200 may be improved.

In an exemplary embodiment, a planarization layer 209 is disposed on the lower planarization layer 208 to cover the second power line PL2. The planarization layer 209 may include an organic insulating material such as general purpose polymers. The general purpose polymers may include polymethylmethacrylate (PMMA) or polystyrene (PS), polymer derivatives having phenolic groups, acrylic polymers, imide-based polymers, aryl ether-based polymers, amide-based polymers, fluorine-based polymers, p-xylene-based polymers, vinyl alcohol-based polymers, and blends thereof. In an embodiment, the planarization layer 209 includes polyimide.

In an exemplary embodiment, the planarization layer 209 has an upper surface that is approximately flat or completely flat. In an exemplary embodiment, the pixel electrode 221 is formed on the planarization layer 209. The pixel electrode 221 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Jr), chromium (Cr), or a compound thereof. In another embodiment, the pixel electrode 221 may further include a layer including ITO, IZO, ZnO, or $In_2O_3$ on or below the above-described reflective layer.

In an exemplary embodiment, a pixel defining layer 211 is formed on the pixel electrode 221. The pixel defining layer 211 may include an opening 211OP exposing an upper surface of the pixel electrode 221, while covering an edge of the pixel electrode 221. Accordingly, the pixel defining layer 211 may define a light-emitting area of a pixel. The pixel defining layer 211 may include an organic insulating material.

In an exemplary embodiment, an intermediate layer 222 is disposed in the opening 211OP to cover the exposed part of the pixel electrode 221. The intermediate layer 222 of the organic light-emitting diode OLED may include a low molecular or polymer material. When including a low molecular material, the intermediate layer 222 may have a stack structure having a single or composite structure of a hole injection layer (HIL), a hole transport layer (HTL), an emission layer (EML), an electron transport layer (ETL), and an electron injection layer (EIL), and may include various organic materials such as copper phthalocyanine (CuPc), N,N'-Di(naphthalene-1-yl)-N,N'-diphenyl-benzidine (NPB), or tris-8-hydroxyquinoline aluminum ($Alq_3$). These layers may be formed in a vacuum deposition method.

When the intermediate layer 222 includes a polymer material, the intermediate layer 222 may generally have a structure including an HTL and an EML. In this state, HTL may include PEDOT, and the EML may include polyphenylenevinylene (PPV)-based and polyfluorene-based polymer materials. The intermediate layer 222 may be formed by a screen print method, an inkjet print method, or a laser induced thermal imaging (LITI) method.

The intermediate layer 222 is not limited thereto and may have various structures. The intermediate layer 222 may include an integrated layer covering a plurality of pixel electrodes 221 and may include a layer patterned to correspond to each of the pixel electrodes 221.

A common electrode 223 includes a conductive material. The conductive material may have a low work function. For example, the common electrode 223 may include a (semi-) transparent layer including silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), or an alloy thereof. Alternatively, the common electrode 223 may further include a layer such as ITO, IZO, ZnO, or $In_2O_3$ on the (semi-) transparent layer including the above-described material. The common electrode 223 may be formed not only in a display area (e.g., display unit 200), but also in a non-display area. The non-display area may surround the display area. The intermediate layer 222 and the common electrode 223 may be formed by a thermal deposition method. The common electrode 223 may be formed on the entire surface of the substrate 100 and partially on side surfaces of the through holes V.

A capping layer (not shown) for protecting the common electrode 223 may be further disposed on the common electrode 223. The capping layer may include lithium fluoride LiF, an inorganic material, or/and an organic material.

The lower planarization layer 208, the planarization layer 209, and the pixel defining layer 211 may include an inorganic contact hole ICH that exposes the inorganic protection layer PVX at the edge of the island 101. The inorganic contact area ICA may be defined by an area where the inorganic contact hole ICH exposes the inorganic protection layer PVX.

The inorganic contact hole ICH may be formed of a first hole 208H of the lower planarization layer 208, a second hole 209H of the planarization layer 209, and a third hole 211H of the pixel defining layer 211 that are connected to each other. Accordingly, inner side surfaces of the inorganic contact hole ICH may form steps.

Since the common electrode 223 is disposed in the inorganic contact hole ICH, the inorganic protection layer PVX that includes an inorganic material and the common electrode 223 may directly contact each other. In an exemplary embodiment, an end portion of the inorganic protection layer PVX directly contacts the common electrode 223. Since parts of the lower planarization layer 208, the planarization layer 209, the pixel defining layer 211, which include an organic material, are removed, the inorganic contact hole ICH is formed, and thus the inorganic contact area ICA may prevent intrusion of moisture into the organic light-emitting diode OLED through the organic material.

Next, a stack structure disposed in one of the first connection parts 102a is described below.

The buffer layer 201, the gate insulating layer 203, the first interlayer insulating layer 205, and the second interlayer insulating layer 207, which are disposed in the island 101, may extend to the first connection part 102a of the substrate 100 so as to be disposed therein. The buffer layer 201, the gate insulating layer 203, the first interlayer insulating layer 205, and the second interlayer insulating layer 207 may include an inorganic material, which may be referred to as an inorganic insulating layer 215. The inorganic insulating layer 215 may include an opening area OA corresponding to a part of the first connection part 102a. In other words, the buffer layer 201, the gate insulating layer 203, the first interlayer insulating layer 205, and the second interlayer insulating layer 207 each may have openings corresponding to the part of the first connection parts 102a. Although, in the drawings, the openings are illustrated to have inner side surfaces that match each other, embodiments of the disclosure are not limited thereto. For example, the side surface of the inorganic insulating layer 215 forming the opening area OA may have a step.

The display apparatus according to an exemplary embodiment of the disclosure includes an organic material layer 202 that fills the opening area OA of the inorganic insulating layer 215. Since the first connection part 102a of the substrate 100 has a width that is less than that of the island 101, the first connection part 102a may be weak to stress generated when the display apparatus 10 is deformed.

In an exemplary embodiment of the disclosure, in the first connection part 102a, the opening area OA is formed by removing a part of the inorganic insulating layer 215 having a high crack generation probability, the organic material layer 202 is disposed in the opening area OA, and thus the generation of cracks may be prevented or reduced even when the display apparatus 10 is deformed.

In an exemplary embodiment, the width of the opening area OA is less than the length of the first connection part 102a. In other words, a part of the inorganic insulating layer 215 may extend to the first connection parts 102a so as to be disposed therein. An end portion EG of the inorganic insulating layer 215 is disposed on the first connection part 102a. In other words, the end portions EG of the buffer layer 201, the gate insulating layer 203, the first interlayer insulating layer 205, and the second interlayer insulating layer 207 may be disposed on the first connection part 102a.

The organic material layer 202 may be disposed to cover the end portion EG of the inorganic insulating layer 215. Alternatively, the organic material layer 202 may be understood as filling the opening area OA and extending to an upper surface of the inorganic insulating layer 215 so as to be disposed thereon. The lines PL1, PL2, and WL for transmitting a voltage or a signal to the display unit 200 are disposed on the organic material layer 202. The organic material layer 202 may reduce a height difference when the lines PL1, PL2, and WL extend to the island 101 and simultaneously absorb stress that may be applied to the lines PL1, PL2, and WL.

The organic material layer 202 may include an organic insulating material such as polyimide, polyamide, acryl resin, benzocyclobutene, hexamethyldisiloxane (HMDSO), and phenol resin. The organic material layer 202 may have a structure of a single layer or a multiple layer of an organic insulating material as above.

The line WL and the first power line PL1 disposed on the organic material layer 202 may include the same material as that of the source electrode SE or the drain electrode DE of the thin film transistor TFT disposed on the island 101. Alternatively, the line WL disposed on the organic material layer 202 may include the same material as that of the gate electrode GE of the thin film transistor TFT. The line WL may be a line for transmitting a signal to the pixel circuit PC. For example, the line WL may be a data line for transmitting a data signal (e.g., Dm) to the pixel circuit PC. Alternatively, the line WL may be a scan line for transmitting a scan signal (e.g., Sn) to the pixel circuit PC. The line WL and the first power line PL1 may be covered by the lower planarization layer 208.

The second power line PL2 may be disposed on the lower planarization layer 208. In the present embodiment, the second power line PL2 may be disposed on a layer different from a layer where the first power line PL1 and the line WL are disposed. Accordingly, the second power line PL2 is formed to overlap various lines WL and PL1, thereby improving the density.

Although, in the drawings, one first power line PL1 and one line WL are illustrated, embodiments of the disclosure are not limited thereto. The first power line PL1 and the line WL disposed on one first connection part 102a may include a plurality of first power lines PL1 and a plurality of lines WL, respectively.

The second power line PL2 is covered by the planarization layer 209, and the planarization layer 209 may include the contact portion CCNT that exposes a part (e.g., upper surface) of the second power line PL2. A contact electrode COE may be provided in the contact portion CCNT. The contact electrode COE may include the same material as the pixel electrode 221. The contact electrode COE may be introduced to prevent the second power line PL2 from being damaged during a manufacturing process. The contact electrode COE may be disposed between the second power line PL2 and the common electrode 223.

In an exemplary embodiment, the common electrode 223 is entirely formed over the island 101 and the first connection part 102a and is connected to the second power line PL2 via the contact portion CCNT. In an embodiment, the common electrode 223 is connected to the second power line PL2 through the contact electrode COE disposed in the contact portion CCNT. In another embodiment, the common electrode 223 directly contacts the second power line PL2. For example, the contact electrode COE may be omitted.

In an embodiment, the contact portion CCNT is disposed on the inorganic insulating layer 215 such as the buffer layer 201 extending from the island 101. In other words, the contact portion CCNT may be disposed on the first connection part 102a to overlap the buffer layer 201, the gate insulating layer 203, the first interlayer insulating layer 205, and/or the second interlayer insulating layer 207. In this case, when the contact portion CCNT is formed, a height difference from the area of the island 101 is relatively small, which may be advantageous in a manufacturing process.

However, embodiments of the disclosure are not limited thereto. The contact portion CCNT may be variously modified such that the contact portion CCNT is formed in the opening area OA that is an area where the inorganic insulating layer 215 is removed.

Figure 6:
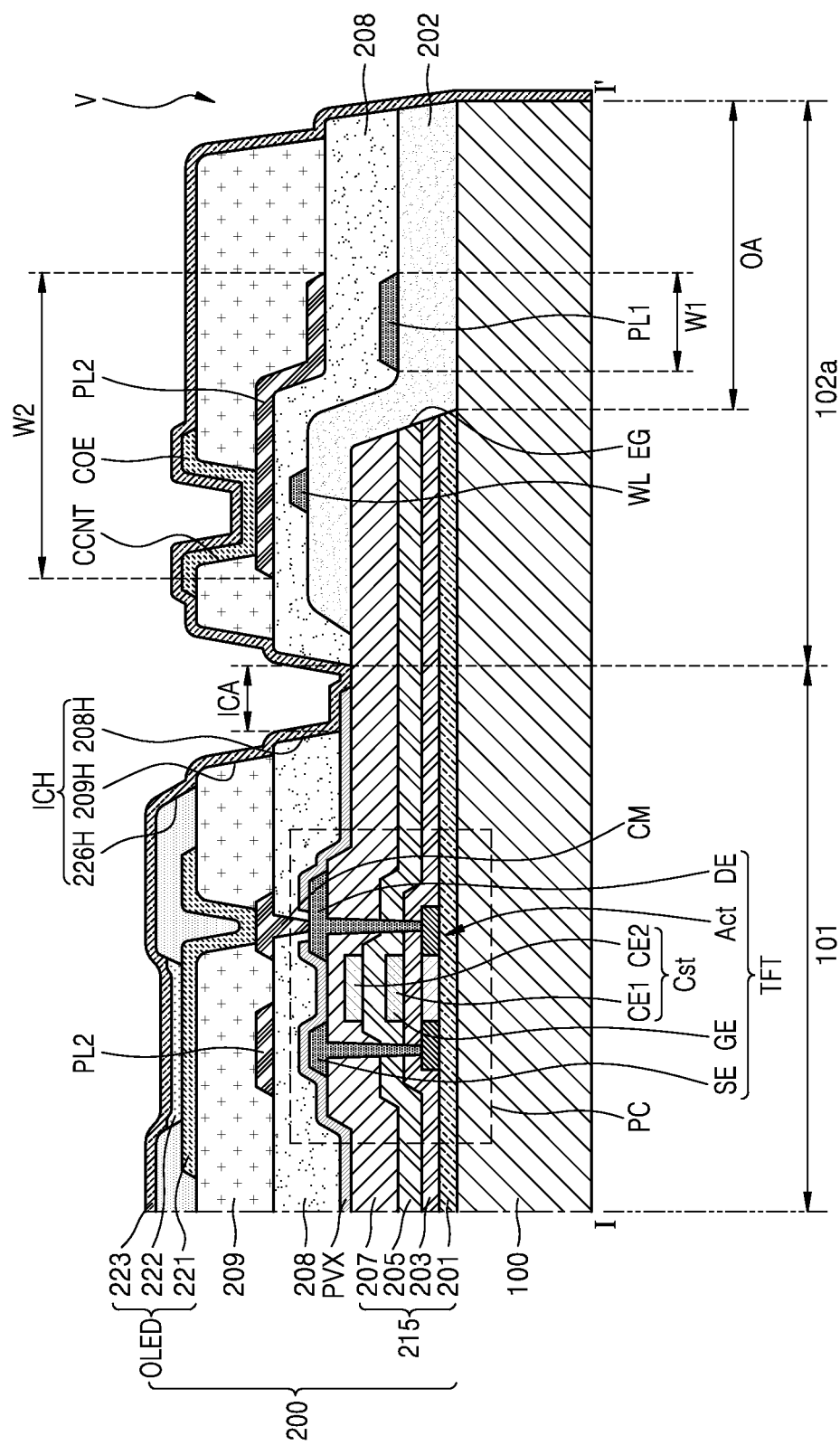
FIG. 6 is a schematic cross-sectional view of a display apparatus according to an exemplary embodiment of the disclosure.

FIG. 6 is a schematic cross-sectional view of a display apparatus according to an exemplary embodiment of the disclosure. In FIG. 6, reference numerals are the same as those of FIG. 5, and redundant descriptions thereof are omitted.

Referring to FIG. 6, the display apparatus includes the island 101 and the substrate 100 having the first connection parts 102a. The display element is provided on the island 101, and the common electrode 223 of the display element and the contact portion CCNT to which the second power line PL2 is connected is disposed on the first connection part 102a. Furthermore, the first power line PL1 and the second power line PL2 are disposed in the first connection parts 102a on layers different from each other.

Although FIG. 5 illustrates that the first power line PL1 and the second power line PL2 are not overlapped with each other on the first connection parts 102a, embodiments of the disclosure are not limited thereto. As illustrated in FIG. 6, the second power line PL2 overlaps the first power line PL1. Since the second power line PL2 is disposed on a layer different from a layer where the first power line PL1 is disposed, a width W2 of the second power line PL2 may be greater than a width W1 of the first power line PL1. Accordingly, a voltage drop phenomenon in the second power voltage ELVSS may be remarkably reduced.

Figure 7:
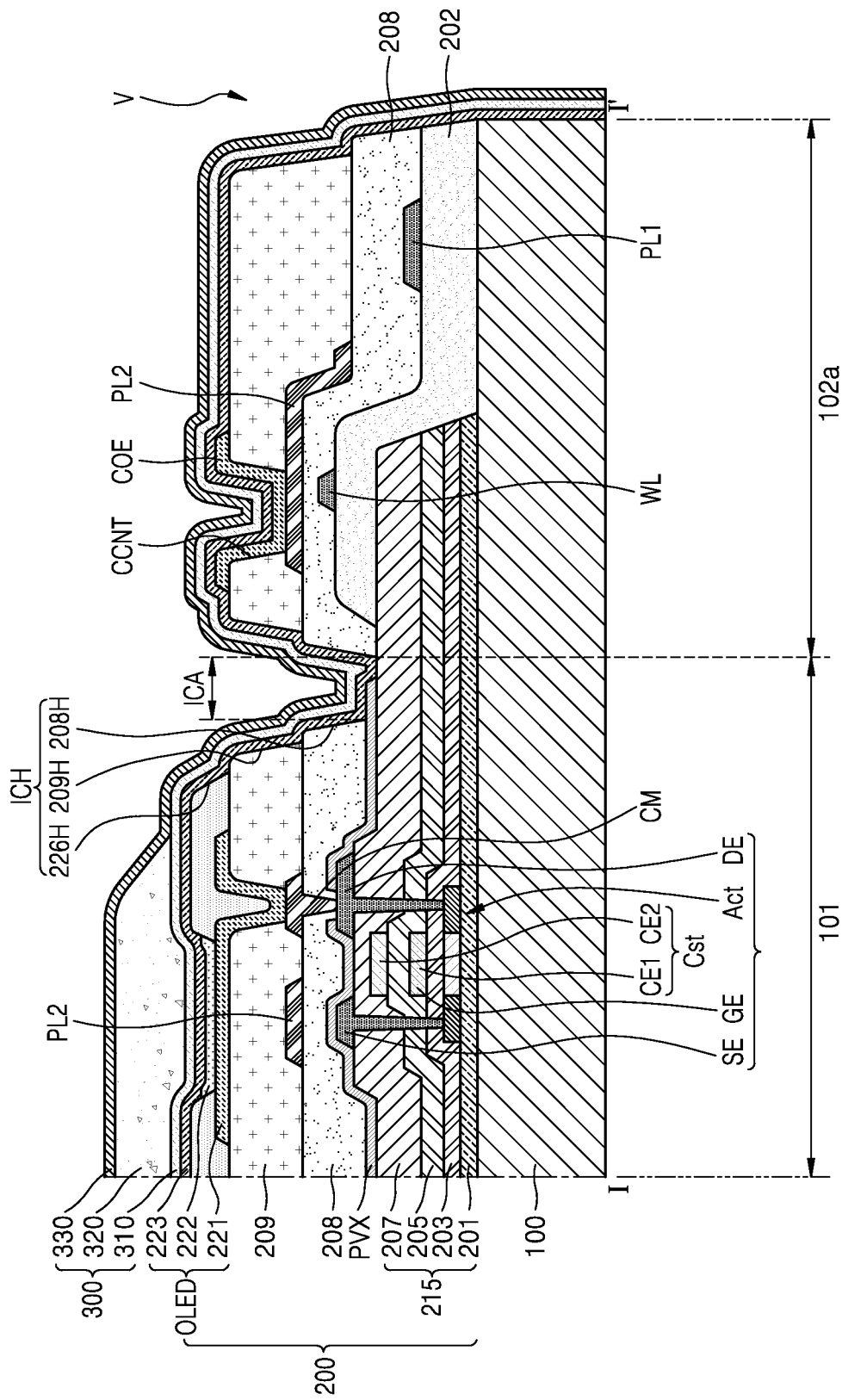
FIG. 7 is a schematic cross-sectional view of a display apparatus according to an exemplary embodiment of the disclosure.

FIG. 7 is a schematic cross-sectional view of a display apparatus according to an exemplary embodiment of the inventive concept. In FIG. 7, reference numerals are the same as those of FIG. 5, and redundant descriptions thereof are omitted.

Referring to FIG. 7, the display apparatus includes an encapsulation layer 300 sealing the display unit 200. The encapsulation layer 300 may block external oxygen and moisture and may include a single layer or a multiple layer. The encapsulation layer 300 may include at least one of an organic encapsulation layer and an inorganic encapsulation layer.

Although FIG. 7 illustrates that the encapsulation layer 300 includes a first inorganic encapsulation layer 310 and a second inorganic encapsulation layer 330 and an organic encapsulation layer 320 interposed therebetween, embodiments of the disclosure are not limited thereto. In other embodiments, the number of organic encapsulation layers, the number of inorganic encapsulation layers, and a stacking order may be changed.

The first and second inorganic encapsulation layers 310 and 330 may include at least one inorganic insulating material such as an aluminum oxide, titanium oxide, tantalum oxide, hafnium oxide, zinc oxide, silicon oxide, silicon nitride, or silicon oxynitride, and may be formed by a chemical vapor deposition (CVD) method. The organic encapsulation layer 320 may include a polymer-based material. The polymer-based material may include acrylic resin, epoxy-based resin, polyimide, and polyethylene.

Since the first inorganic encapsulation layer 310 is formed according to a structure thereunder, an upper surface of the first inorganic encapsulation layer 310 is not flat as illustrated in FIG. 7. The organic encapsulation layer 320 covers the first inorganic encapsulation layer 310 so as to have an approximately flat upper surface unlike the first inorganic encapsulation layer 310. In an exemplary embodiment, the organic encapsulation layer 320 has an approximately flat upper surface in a portion corresponding to the organic light-emitting diode OLED that is the display element. Furthermore, the organic encapsulation layer 320 may reduce stress generated in the first and second inorganic encapsulation layers 310 and 330.

The organic encapsulation layer 320 may include polymethylmethacrylate (PMMA), polycarbonate (PC), polystyrene (PS), acrylic resin, epoxy-based resin, polyimide, polyethylene, polyethylene sulfonate, polyoxymethylene, polyarylate, or hexamethyldisiloxane.

In an exemplary embodiment, the organic encapsulation layer 320 includes a plurality of unit organic encapsulation layers 320u respectively corresponding to the display units 200. In other words, each unit organic encapsulation layer 320u may be disposed on the island 101 of the substrate 100, not in the connection part 102. Accordingly, since the first inorganic encapsulation layer 310 and the second inorganic encapsulation layer 330 contact each other at an edge of the unit organic encapsulation layer 320u, each of the display units 200 may be individually encapsulated.

Since the encapsulation layer 300 may include the first inorganic encapsulation layer 310, the organic encapsulation layer 320, and the second inorganic encapsulation layer 330, even when cracks occur in the encapsulation layer 300, due to the multiple layer structure, the cracks may be prevented from being connected to each other between the first inorganic encapsulation layer 310 and the organic encapsulation layer 320 or between the organic encapsulation layer 320 and the second inorganic encapsulation layer 330. Accordingly, the formation of a path through which external moisture or oxygen intrudes into the display units 200 may be prevented or reduced. Furthermore, since the second inorganic encapsulation layer 330 contacts the first inorganic encapsulation layer 310 at the edge located outside the unit organic encapsulation layer 320*u*, the unit organic encapsulation layer 320*u* may be prevented from being exposed to the outside.

In an exemplary embodiment, the unit organic encapsulation layer 320*u* is not disposed in the inorganic contact area ICA. Since the first inorganic encapsulation layer 310 and the second inorganic encapsulation layer 330 directly contact each other in the inorganic contact area ICA, the inorganic protection layer PVX, the common electrode 223, the first inorganic encapsulation layer 310, and the second inorganic encapsulation layer 330, which are inorganic material layers, are sequentially stacked in the inorganic contact area ICA.

The first inorganic encapsulation layer 310 and the second inorganic encapsulation layer 330 may be formed on the entire surface of the substrate 100 by using a chemical vapor deposition (CVD) method such that the first inorganic encapsulation layer 310 and the second inorganic encapsulation layer 330 cover a side surface of the through holes V.

The organic encapsulation layer 320 is not disposed on the first connection parts 102*a*. Accordingly, the first inorganic encapsulation layer 310 and the second inorganic encapsulation layer 330 may directly contact each other on the first connection parts 102*a*.

In an exemplary embodiment of the disclosure, the encapsulation layer 300 hermetically seals each of the display units 200. Thus, even when the shape of the display apparatus is deformed, a change in the sealing properties of the encapsulation layer 300 may be reduced.

Figure 8:
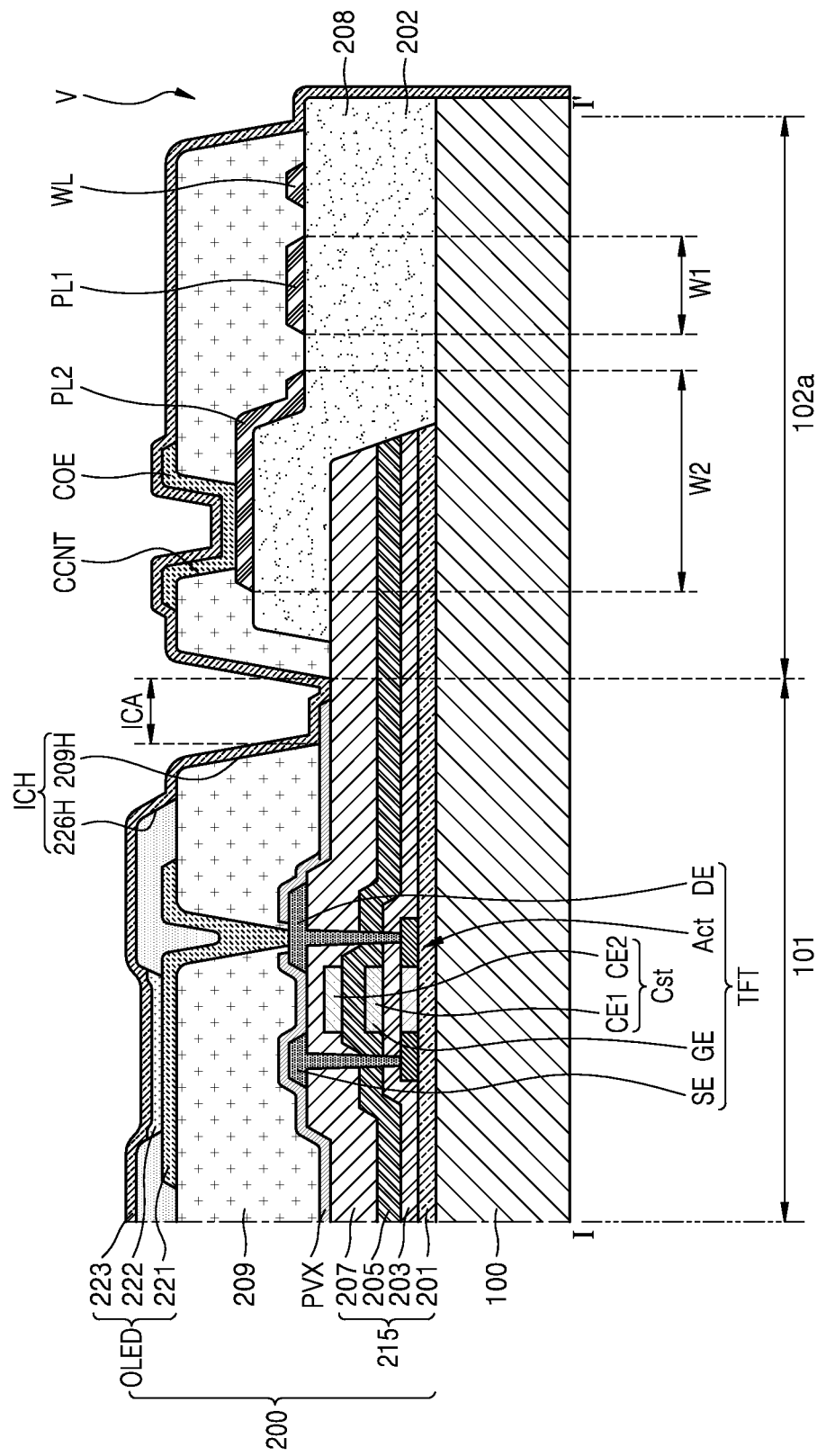
FIG. 8 is a schematic cross-sectional view of a display apparatus according to an exemplary embodiment of the disclosure.

FIG. 8 is a schematic cross-sectional view of a display apparatus according to an exemplary embodiment of the disclosure. In FIG. 8, reference numerals are the same as those of FIG. 5, and redundant descriptions thereof are omitted.

Referring to FIG. 8, the display apparatus includes the substrate 100 having the island 101 and the first connection parts 102*a*. The display element is provided on the island 101, and the common electrode 223 of the display element and the contact portion CCNT to which the second power line PL2 is connected are disposed on the first connection parts 102*a*.

In the present embodiment illustrated in FIG. 8, the first power line PL1, the second power line PL2, and the line WL on the first connection parts 102*a* are disposed on the same layer. For example, the first power line PL1, the second power line PL2, and the line WL may be disposed on the organic material layer 202. In this case, the first power line PL1, the second power line PL2, and the line WL may include the same material as the source electrode SE. Since the first power line PL1, the second power line PL2, and the line WL are disposed on the same layer, in the present embodiment, the lower planarization layer 208 is omitted.

Figure 9:
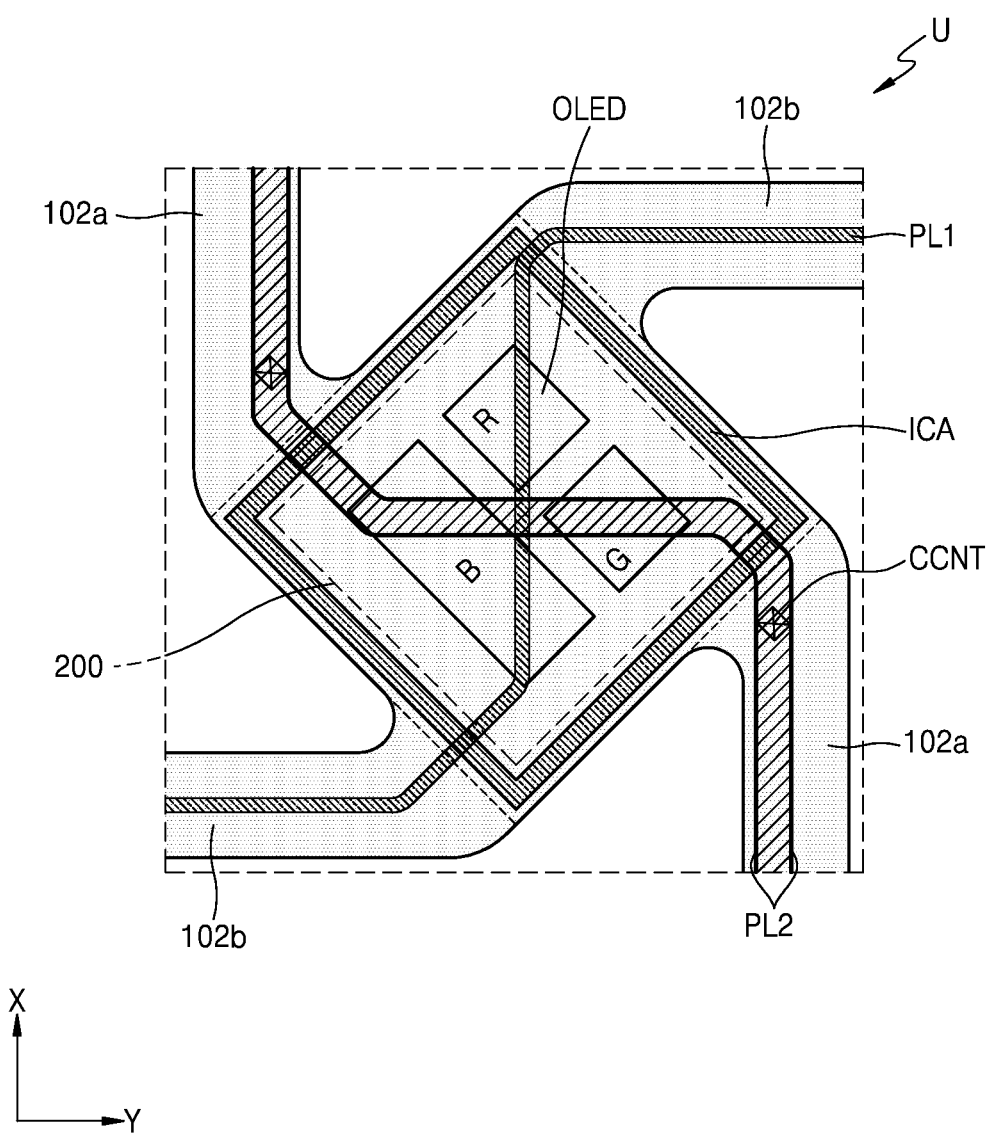
FIG. 9 is a schematic plan view of a display apparatus according to an exemplary embodiment of the disclosure.

FIG. 9 is a schematic plan view of a display apparatus according to an exemplary embodiment of the disclosure. In FIG. 9, reference numerals are the same as those of FIG. 4, and redundant descriptions thereof are omitted.

Referring to FIG. 9, the inorganic contact area ICA surrounding the display unit 200 may be located on the island 101 of the basic unit U, and the connection part 102 may include the first connection parts 102*a* located at the opposite sides with respect to the island 101 and each extending in a direction parallel to the first direction X, and the second connection parts 102*b* located at the opposite sides with respect to the island 101 and each extending in a direction parallel to the second direction Y.

In the present embodiment, one of the first power line PL1 and the second power line PL2 is disposed in the first connection parts 102*a*, and the other is disposed in the second connection parts 102*b*.

For example, as illustrated in FIG. 9, the first power line PL1 may be disposed on the second connection parts 102*b* extending in the second direction Y, and the second power line PL2 may be disposed on the first connection parts 102*a* extending in the first direction X. Alternatively, the second power line PL2 may be disposed on the second connection parts 102*b* extending in the second direction Y, and the first power line PL1 may be disposed on the first connection parts 102*a* in the first direction X. Accordingly, the first power line PL1 and the second power line PL2 cross each other in the display unit 200. In this case, the first power line PL1 and the second power line PL2 may be disposed on layers different from each other. The first power line PL1 may include a plurality of first power lines.

Figure 10:
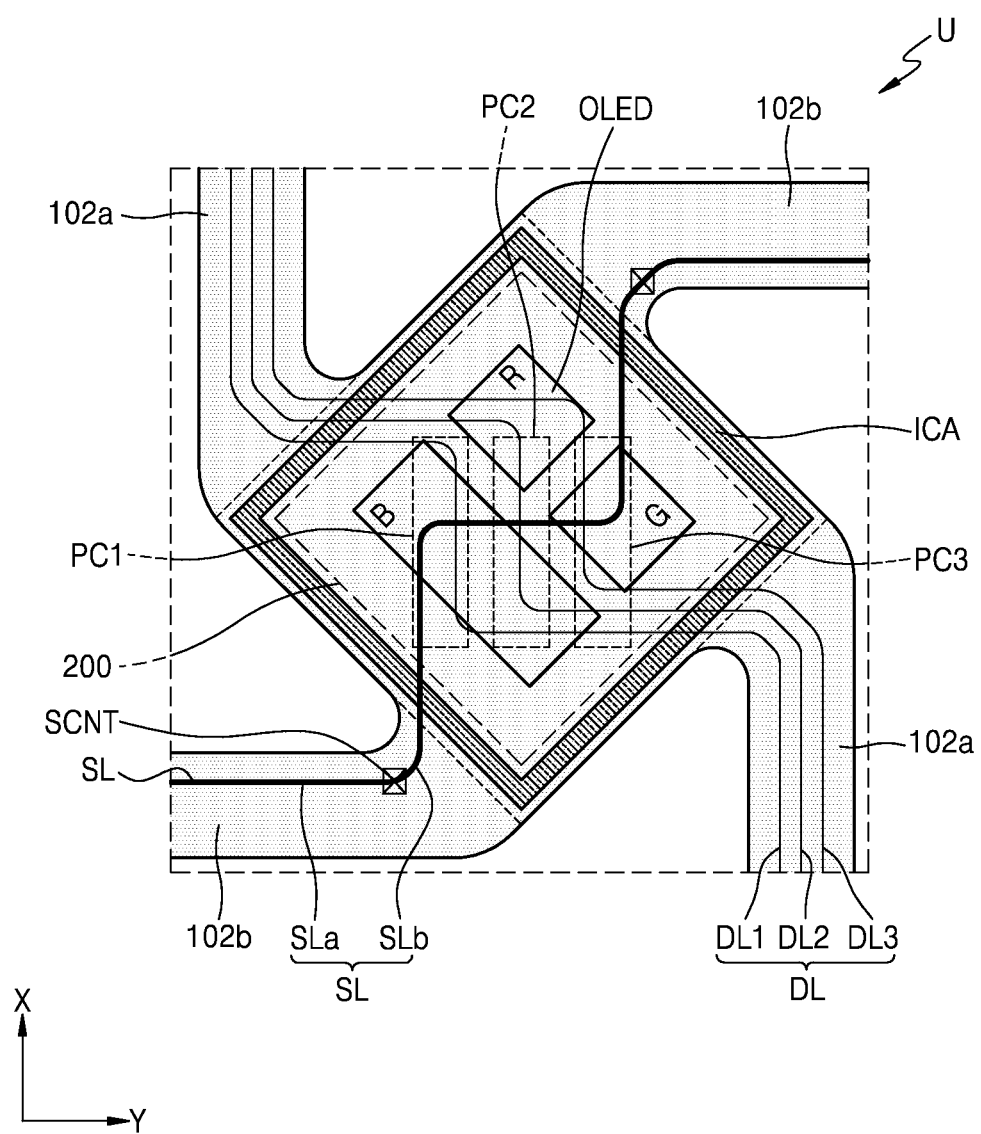
FIG. 10 is a schematic plan view of a signal line applicable to embodiments of the disclosure.

FIG. 10 is a schematic plan view of a signal line applicable to embodiments of the disclosure. In FIG. 10, reference numerals are the same as those of FIG. 4, and redundant descriptions thereof are omitted.

Referring to FIG. 10, the inorganic contact area ICA surrounding the display unit 200 and the display unit 200 are located in the island 101 of the basic unit U, and the connection part 102 includes the first connection parts 102*a* located at the opposite sides with respect to the island 101 and each extending in a direction parallel to the first direction X, and the second connection parts 102*b* located at the opposite sides with respect to the island 101 and each extending in a direction parallel to the second direction Y.

A plurality of pixel circuits PC1, PC2, and PC3 are disposed in the island 101. A first pixel circuit PC1 is connected to a blue (B) OLED, a second pixel circuit PC2 is connected to a red (R) OLED, and a third pixel circuit PC3 is connected to a green (G) OLED, thereby driving the respective OLEDs.

In an exemplary embodiment, the scan line SL extends from the second connection part 102*b* at one side, and passes through the first pixel circuit PC1, the second pixel circuit PC2, and the third pixel circuit PC3 to an adjacent island through the second connection part 102*b* at the other side. The scan line SL includes an upper scan line SLa and a lower scan line SLb which are provided on layers different from each other. The upper scan line Sla may be disposed on the second connection part 102*b* and connected to the lower scan line SLb through a contact hole SCNT. The upper scan line Sla may be disposed on the organic material layer 202 (see FIG. 4). The lower scan line SLb may be disposed on the island 101, and may be disposed on the gate insulating layer 203 (see FIG. 4) or the first interlayer insulating layer 205 (see FIG. 4). The previous scan line SLn−1 and the emission control line EL (see FIG. 3B) may be disposed parallel to the scan line SL.

The data line DL may include a first data line DL1, a second data line DL2, and a third data line DL3. The first data line DL1 may be connected to the first pixel circuit PC1, the second data line DL2 may be connected to the second pixel circuit PC2, and the third data line DL3 may be connected to the third pixel circuit PC3. The first power line PL1 may be disposed parallel to the data line DL. The data line DL may correspond to the line WL of FIGS. 4 to 8. The data line DL and the scan line SL may cross each other in the display unit 200.

According to at least one of the above-described embodiments, a display apparatus having a deformable or stretchable shape may be provided having high luminance uniformity. However, the scope of exemplary embodiments of the disclosure are not limited to the above effect.

While one or more embodiments have been described with reference to the figures, it will be understood by those of ordinary skill in the art that various changes in form and details may be made therein without departing from the spirit and scope of the inventive concept.

What is claimed is:

1. A display apparatus comprising:
   a substrate comprising an island and a plurality of connection parts extending from respective ends of the island and connected to different islands;
   a display region disposed on the island and comprising a display element;
   a common voltage power line disposed on the island and on at least one first connection part of the plurality of connection parts extending from the island;
   a planarization layer disposed on the common voltage power line; and
   at least one contact portion (CNT) disposed on the at least one first connection part and passed through the planarization layer,
   wherein a contact electrode comprised of a conductive oxide is disposed in the at least one contact portion to be connected to a common electrode of the display element and the common voltage power line, and to be completely covered by the common electrode,
   wherein the common electrode is continuously disposed on the at least one contact portion, and the common electrode and the common voltage power line overlap the at least one contact portion, and
   wherein the contact electrode is a separate layer from that of the common electrode and the common voltage power line.

2. The display apparatus of claim 1, further comprising:
   a driving voltage power line disposed on at least one of the islands, wherein the driving voltage power line is disposed on a layer different from a layer where the common voltage power line is disposed.

3. The display apparatus of claim 2, wherein the driving voltage power line is disposed on the at least one first connection part and is arranged to overlap the common voltage power line.

4. The display apparatus of claim 2, wherein a width of the common voltage power line is greater than a width of the driving voltage power line.

5. The display apparatus of claim 1, further comprising:
   a thin film transistor disposed on the island and connected to the display element; and
   an inorganic protection layer disposed between the thin film transistor and the display element, wherein the inorganic protection layer directly contacts the common electrode in an inorganic contact area, and the inorganic contact area is disposed to surround the display region.

6. The display apparatus of claim 5, wherein the at least one contact portion is disposed outside the inorganic contact area.

7. The display apparatus of claim 5, further comprising:
   an encapsulation layer comprising an organic encapsulation layer, a first inorganic encapsulation layer disposed under the organic encapsulation layer, and a second inorganic encapsulation layer disposed on the organic encapsulation layer, wherein the organic encapsulation layer overlaps the display region, and the first inorganic encapsulation layer and the second inorganic encapsulation layer contact each other in the inorganic contact area.

8. The display apparatus of claim 7, wherein the first inorganic encapsulation layer and the second inorganic encapsulation layer are disposed on the substrate, and the first inorganic encapsulation layer and the second inorganic encapsulation layer contact each other on the plurality of connection parts.

9. The display apparatus of claim 7, wherein the substrate comprises a plurality of through holes penetrating the substrate around the island, and the first inorganic encapsulation layer and the second inorganic encapsulation layer are disposed at least partially on a side surface of the plurality of through holes.

10. The display apparatus of claim 1, further comprising:
    at least one inorganic insulating layer disposed under the display element, wherein the at least one inorganic insulating layer comprises an opening area corresponding to at least a part of each of the plurality of connection parts, and the opening area is filled by at least one organic material layer.

11. The display apparatus of claim 10, wherein the at least one contact portion is disposed on the at least one inorganic insulating layer.

12. The display apparatus of claim 1, further comprising:
    a driving voltage power line disposed on at least one of the island and the plurality of connection parts, wherein the driving voltage power line is disposed on a same layer as a layer where the common voltage power line is disposed.

13. The display apparatus of claim 12, wherein a width of the common voltage power line is greater than a width of the driving voltage power line.

14. The display apparatus of claim 1, further comprising:
    a driving voltage power line disposed on the island and on at least one second connection part of the plurality of connection parts extending in a direction different from a direction in which the at least one first connection part extends, wherein the common voltage power line crosses the driving voltage power line in the display region.

15. The display apparatus of claim 1, further comprising:
    an upper scan line disposed on at least one second connection part of the plurality of connection parts extending in a direction different from a direction in which the at least one first connection part extends; and
    a lower scan line disposed on the island, wherein the upper scan line and the lower scan line are disposed in layers different from each other and are connected to each other via a contact hole disposed in the at least one second connection part.

16. The display apparatus of claim 15, further comprising:
a plurality of data lines disposed on the at least one first connection part, wherein the plurality of data lines and the upper scan lines are disposed on a same layer.

17. A display apparatus comprising:
a substrate comprising a plurality of islands spaced apart from each other, a plurality of connection parts connecting the plurality of islands, and a plurality of through holes penetrating the substrate between the plurality of connection parts;
a plurality of display regions respectively disposed on the plurality of islands, each display region comprising an organic light-emitting diode;
an encapsulation layer hermetically sealing each of the plurality of display regions, wherein one of the connection parts comprises a common voltage power line and a contact portion connected to a common electrode of the organic light-emitting diode of one of the display regions of one of the islands and the common voltage power line; and
a contact electrode disposed in the contact portion between the common electrode and the common voltage power line such that the common electrode completely covers the contact electrode, and the common electrode and the common voltage power line overlap at the at least one contact portion,
wherein the common voltage power line provides a voltage to the common electrode via the at least one contact portion,
wherein the contact electrode comprises a conductive oxide, and
wherein the contact electrode is a separate layer from that of the common electrode and the common voltage power line.

18. The display apparatus of claim 17, wherein the contact electrode includes a same material as a material of a pixel electrode of the organic light-emitting diode.

19. The display apparatus of claim 17, further comprising:
a driving voltage power line disposed on the one island and on part of the plurality of connection parts, wherein the driving voltage power line is disposed on a layer different from a layer where the common voltage power line is disposed.

20. The display apparatus of claim 19, wherein the driving voltage power line is disposed to overlap at least part of the common voltage power line.

21. The display apparatus of claim 17, the one display region further comprising:
a thin film transistor connected to the organic light-emitting diode; and
an inorganic protection layer disposed between the thin film transistor and the organic light-emitting diode,
wherein the inorganic protection layer directly contacts the common electrode in an inorganic contact area, and the inorganic contact area surrounds the one display region.

22. The display apparatus of claim 21, wherein the encapsulation layer comprises a first inorganic encapsulation layer, an organic encapsulation layer, and a second inorganic encapsulation layer and the first inorganic encapsulation layer and the second inorganic encapsulation layer directly contact each other in the inorganic contact area.

23. A display apparatus comprising:
a substrate comprising a first pair of islands spaced apart from each other in a first direction and a second pair of islands spaced apart from each other in the first direction, the first pair spaced apart from the second pair in a second direction different from the first direction, each island comprising a display region including at least one display element;
a plurality of connection parts comprising a first connection part connecting the islands of the first pair, a second connection part connecting the islands of the second pair, a third connection part connecting a first island of each of the pairs, and fourth connection part connecting a second island of each of the pairs;
an inorganic layer entirely surrounding the display region of each of the islands;
a common voltage power line disposed to overlap an organic emission layer of an organic light-emitting diode (OLED) of the at least one least display element; and
a contact portion disposed on at least one of the connection parts, wherein a contact electrode comprised of a conductive oxide is disposed in the contact portion to be connected to the common voltage power line, completely covered by the common electrode and located entirely outside each of the islands,
wherein the common voltage power line provides a voltage to a common electrode of the OLED via the contact portion, and
wherein the contact electrode is a layer that is separate layer from that of the common electrode and the common voltage power line.

24. The display apparatus of claim 23, further comprising:
a first power line for transmitting a first power voltage to one of the display regions of one of the islands, the first power line disposed on one of the connection parts connected to one end of the one island and on an additional connection part connected to another end of the one island; and
a second power line for transmitting a second power voltage different from the first power voltage to the one display region, the second power line disposed on the one connection part and the additional connection part.

25. The display apparatus of claim 23, further comprising:
a first power line for transmitting a first power voltage to one of the display regions of one of the islands, the first power line disposed on one of the connection parts connected to a first end of the one island and on a first additional connection part connected to a second end of the one island opposing the first end; and
a second power line for transmitting a second power voltage different from the first power voltage to the one display region, the second power line disposed on a second additional connection part connected to a third end of the one island and on a third additional connection part connected to a fourth end of the one island opposing the third end.

* * * * *